(12) United States Patent
Zhao

(10) Patent No.: US 6,586,789 B1
(45) Date of Patent: Jul. 1, 2003

(54) PIXEL IMAGE SENSOR

(76) Inventor: Lixin Zhao, 43454 Bryant St., Fremont, CA (US) 94539

( * ) Notice: Subject to any disclaimer, the term of this patent is extended or adjusted under 35 U.S.C. 154(b) by 0 days.

(21) Appl. No.: 10/266,839

(22) Filed: Oct. 7, 2002

(51) Int. Cl.$^7$ .................. H01L 31/062; H01L 31/113
(52) U.S. Cl. ........................................ 257/292; 257/291
(58) Field of Search ............................... 257/223, 229, 257/230, 297, 292

(56) References Cited

U.S. PATENT DOCUMENTS

| | | | | |
|---|---|---|---|---|
| 5,416,345 A | * | 5/1995 | Matsunaga | 257/222 |
| 5,898,195 A | * | 4/1999 | Harada | 257/223 |
| 5,904,493 A | * | 5/1999 | Lee et al. | 438/57 |
| 6,051,447 A | * | 4/2000 | Lee et al. | 438/48 |

* cited by examiner

*Primary Examiner*—Ngân V. Ngô
(74) *Attorney, Agent, or Firm*—Ivy Y. Mei

(57) ABSTRACT

Pixel image sensors with lateral photodiode elements and vertical overflow drain systems. According to at least one embodiment of the present invention, an image sensor pixel includes a lateral photodiode element and a vertical overflow drain system for draining excessive charges accumulated in the charge collecting region of the lateral photodiode element and for resetting the charge collecting region of the lateral photodiode element.

18 Claims, 9 Drawing Sheets

PIXEL IMAGE SENSOR

FIELD OF THE TECHNOLOGY

Embodiments of the present invention relate to solid-state image sensors.

BACKGROUND

Image sensors can be used in a variety of applications, such as digital still cameras, PC cameras, digital camcorders and Personal Communication Systems (PCS), as well as analog and digital TV and video systems, video game machines, security cameras and micro cameras for medical treatment. With the development of the telecommunication and computer system, the demand for image sensors will be much more increased.

An image sensor cell typically has a photodiode element, which is capable of converting light (e.g., visible light, infrared light and ultraviolet light) into electric signals. When photons are absorbed, electron-hole pairs are created through photoelectric conversion. A depletion region is formed in a photodiode when the photodiode is reverse-biased. The electric field in the depletion region separates the electron-hole pairs generated from photoelectric conversion.

The electric current generated from the photoelectric conversion can be directly measured to determine the intensity of the light. However, the signal generated from the direct measurement of the current from photoelectric conversion typically has a poor signal to noise (S/N) ratio. Thus, a typical image sensor accumulates the charges generated from photoelectric conversion for a predetermined period; and, the amount of accumulated charges is measured to determine the intensity of the light.

To measure the accumulated photoelectric charges, a CMOS (Complementary Metal-Oxide Semiconductor) Active Pixel Sensor (APS) contains active circuit elements (e.g., transistors) for measuring the signal associated with the accumulated photoelectric charges. Alternatively, the accumulated charges can be moved out of image sensor cell for measurement (e.g., in a CMOS Passive Pixel Sensor (PPS) or in a Charge Coupled Device (CCD) image sensor). In order to prevent noise, a CCD image sensor uses a complicated process to transfer the accumulated charges from the sensor cell to an amplifier for measurement. A CCD device uses complicated driving signals of large voltage swings, and thus, consumes a lot of power. While a CMOS PPS can be fabricated using a standard CMOS process, a typical CMOS PPS has a poor Signal to Noise (SIN) ratio. A typical CCD fabrication process is optimized for charge transfer; and it is not compatible with a standard CMOS process. Thus, a CCD image sensor is difficult to be integrated with signal processing circuitry, which is typically implemented by Complementary Metal-Oxide Semiconductor (CMOS) circuitry, and thus, difficult to be implemented in a wider variety of applications.

A CMOS APS detects (or amplifies) the signal within the sensor cell to greatly reduce the noise in determining the signal. However, the circuit in a typical CMOS APS sensor cell consumes an amount of area, resulting in a reduced fill factor and low sensitivity. Another typical drawback associated with a CMOS APS sensor is high reset noise. A CCD sensor can allocate a large area for the light-sensing element, since the amplifiers and detecting circuits are not in the image sensor cell, when a double correlated sampling circuit is implemented. Thus, a CCD sensor typically has a large fill factor and high sensitivity. However, the transistors for correlated double sampling on a CMOS APS sensor can further reduce the sensor fill factor. Thus, many CMOS APS sensors using none correlated double sampling to balance the need for a large fill factor and reduced reset noise.

Although a CMOS image sensor, fabricated using the related simple CMOS process, typically has low power consumption, single power supply and the capability of on-chip system integration, in contrast with CCD image sensors, CMOS image sensors has not been yet widely used in image capture application because of low sensitivity and high noise.

SUMMARY OF THE DESCRIPTION

Pixel image sensors with lateral photodiode elements and vertical overflow drain systems are described herein.

According to at least one embodiment of the present invention, an image sensor pixel includes a lateral photodiode element and a vertical overflow drain system for draining excessive charges accumulated in the charge collecting region of the lateral photodiode element and for resetting the charge collecting region of the lateral photodiode element.

In one example according to the present invention, the lateral photodiode element has an N-type region and a P-type region separated by an intrinsic (or P- or N-) semiconductive material; the N-type region is surrounded by the intrinsic semiconductive material; and, the P-type region of the lateral photodiode element is shaped to substantially enclose the N-type region to form a P-I-N type lateral photodiode element. The vertical overflow drain system is formed by a layer of the intrinsic (or P- or N-) semiconductive material separating the lateral photodiode element and an N-type substrate. When the lateral photodiode element is reverse biased, the N-type region collects electric charges generated from photoelectric conversion in the lateral photodiode element. When: 1) the P-type region is at a first potential level (e.g., 0 V), 2) the N-type region is at second potential level (e.g. 1 V), and 3) the substrate is at a third potential level (e.g., 0.2 V), a potential barrier formed in the vertical overflow drain system prevents the electric charges accumulated in the N-type region from moving across the intrinsic layer into the substrate until the N-type region approaches a overflow potential level (e.g., 0.2 V). When the N-type region is forced to approach the overflow potential level, the electric charges in the N-type region are capable of moving across the intrinsic layer into the substrate. Thus, the charge collecting region (the N-type region) can be reset by forcing the charge collection region to approach the overflow potential level. In one example, the lateral photodiode element is not forward biased when the N-type region is forced to approach the overflow potential level while the P-type region remains at the first potential level.

In one example according to the present invention, an image sensor pixel includes a capacitor for applying control signals and a transistor for reading out signals, in addition to the lateral photodiode element and the vertical overflow drain system. The gate of the transistor is connected to the charge collecting region (e.g., the N-type region); and, the capacitor has one surface connected to the charge collecting region and the other surface connected to the control signal line. In one example, the other surface of the capacitor is connected to a drain region of the transistor. In one example, the P-type region is maintained at one potential level (e.g., 0 V); and, the substrate is maintained at another potential level (e.g., 2 V). In a reset operation, the control signal line is set to 0 V. The potential level of the N-type region follows the control signal through capacitor coupling. However, the potential level of the N-type region will not go beyond an overflow point (e.g., 0.2 V). When the potential level of the N-type region reach the overflow level, charges accumulated in the N-type region flow to the substrate; and, the potential level of the N-type region remains the overflow point. After the reset operation, the control signal line is set to 2 V to accumulate photoelectric charges. The potential level of the N-type region follows the control signal through capacitor coupling (e.g., to 1 V) to a level below the overflow point so that a potential barrier is formed in the vertical overflow drain system. The potential barrier prevents photoelectric electrons accumulated in the N-type region from moving into the substrate; and, the potential barrier also prevents electrons from moving from the substrate to the N-type region. Thus, the electrons from photoelectric conversion in the lateral photodiode element are collected and accumulated in the N-type region. When the control signal line is maintained at the potential level for accumulation (e.g., 2 V), the transistor is not activated (not turned on) to generate an output signal; and, the N-type region does not approach the overflow potential level until enough accumulated electrons in the N-type region cause overflow in the vertical overflow drain system. When the control signal line is switched to a potential level for a reading operation (e.g., 5 V), the potential level of the N-type region and the gate of the transistor follows the control signal through the capacitor coupling (e.g., to 2 V). Thus, the transistor is activated (turned on) to output a signal for measuring the electrons accumulated in the N-type region; and, the potential level of the barrier between the N-type region and the substrate is still higher than the potential level of the substrate to prevent the charges in the substrate from flowing into the N-type region. When the control signal line is maintained at a potential level for reset (e.g., 0 V), the transistor is not activated to generate output.

In one example, the N-type region is smaller laterally than the intrinsic region between the N-type region and the P-type region. In one example, the substrate includes a layer of a P-type semiconductive material disposed between the intrinsic layer and an N-type substrate and in the region under the N-type region. In one example, a pinning layer of the second conductive type is formed (e.g., using a typical CMOS process) above the lateral photodiode element to reduce the noise due to the surface state; and, the pinning layer is at least partially in contact with the N-type region, the P-type region and the intrinsic region between the N-type region and the P-type region.

According to at least one embodiment of the present invention, a method to form an image sensor pixel includes: forming a first region of a first conductive type (e.g., N-type) on an intrinsic layer of an intrinsic (or P- or N-) semiconductive material on a substrate of the first conductive type; and, forming a second region of a second conductive type (e.g., P-type) on the intrinsic layer. The first region is substantially enclosed by the second region; and, the first and second regions are separated by an intrinsic region of the intrinsic semiconductive material. The first region, the second region and the intrinsic region between the first and the second regions form a lateral photodiode element. The first region collects electric charges generated from photoelectric conversion in the lateral photodiode element when the lateral photodiode element is reverse biased; and, when the second region is at a second potential level and the substrate is at a third potential level, a potential barrier formed in the vertical overflow drain system prevents electric charges from moving, across the intrinsic layer, between the first region and the substrate, until the first region approaches a first potential level. In one example, the intrinsic layer is grown (e.g., using an epitaxial growth process) with a dopant of the second conductive type (e.g., Boron) to have a dopant density in a range between 1E13 atoms/cm$^3$ and 1E16 atoms/cm$^3$ and a thickness around 2 μm~10 μm, where the substrate is doped with a dopant for the first conductive type (e.g., Phosphorus) to a density in a range between 1E15 atoms/cm$^3$ and 1E18 atoms/cm$^3$. In one example, forming the first and second regions includes implanting at a higher energy level of around 2 MeV or higher, and at a dose in a range between 1E12 atoms/cm$^2$ and 1E14 atoms/cm$^2$ to reach an implant depth around 2 μm. In one example, the first and second regions are separated by the intrinsic semiconductive material 0.5 μm to 10 μm apart in average. In one example, the average implant depth of the second region is larger than the average implant depth of the first region.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

In at least one embodiment of the present invention, a lateral photodiode element is closely coupled to a vertical overflow drain system to provide a pixel image sensor that has a large fill factor and a large dynamic range.

Figure 1:
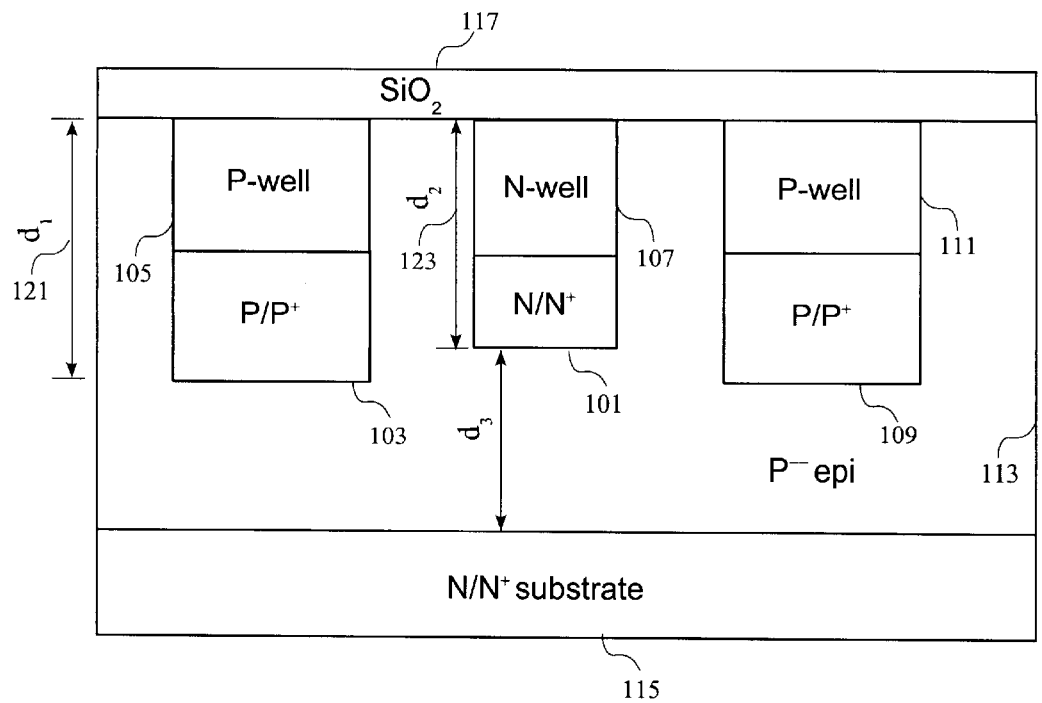
FIG. 1 shows a cross section view of a pixel image sensor according to one one embodiment of the present invention.

FIG. 1 shows a cross section view of a pixel image sensor according to one embodiment of the present invention. In FIG. 1, the pixel image sensor is formed on top of N-type substrate 115 (e.g., doped with Phosphorus to a density of 1E15 atoms/cm$^3$ to 1E18 atoms/cm$^3$). N-type regions 101 and 107 are surrounded by P-epi semiconductive material (e.g., doped with Boron to a density of 1E13 atoms/cm$^3$ to 1E16 atoms/cm$^3$). P-type regions 103, 105, 109 and 111 enclose N-type regions 101 and 107 and their surrounding P-epi semiconductive materials to form a lateral photodiode element. In one embodiment, P-type region (e.g., region 103 and 109) has an average depth larger than the N-type region (e.g., region 101), as shown in FIG. 1, to enclose the N-type region, which serves as the charge collecting region of the lateral photodiode element. A layer of P-epi semiconductive material in P-epi layer 113 separates the lateral photodiode element and substrate 115 to form a vertical overflow drain system.

In one embodiment of the present invention, regions 101, 103 and 109 are doped using deep implant in the P-epi layer. For example, deep N-type region 101 is generated by deep implanting N-type dopant (e.g., Phosphorus) with high energy (e.g., at an energy level of 2 MeV) and a light dose (e.g., 5E12 atoms/cm$^2$); and similarly, deep P-type regions 103 and 109 are generated by deep implanting P-type dopant (e.g., Boron with an energy level of 2 MeV and a dose of 5E12 atoms/cm$^2$).

In one embodiment of the present invention, depth $d_1$ of regions 103 and 109 is about 3 μm; depth $d_2$ of region 101 is about 2 μm; and, depth $d_3$ of the layer of P-epi semiconductive material between the lateral photodiode element and substrate 115 is about 3 μm. In one example, substrate 115 is doped with Phosphorus to a density of 1E16 atom/cm$^3$, having a resistivity of about 60 Ω cm. P-epi layer 113 is doped with Boron to a density of 2E14 atom/cm$^3$. The total thickness of P-epi layer 113 $d_2+d_3$ is typically more than 3 μm (e.g., about 5 μm). Isolation layer 117 is formed on top of the lateral photodiode element. Active circuitry can be formed on P-well using a CMOS process, which will be further described below.

Figure 2:
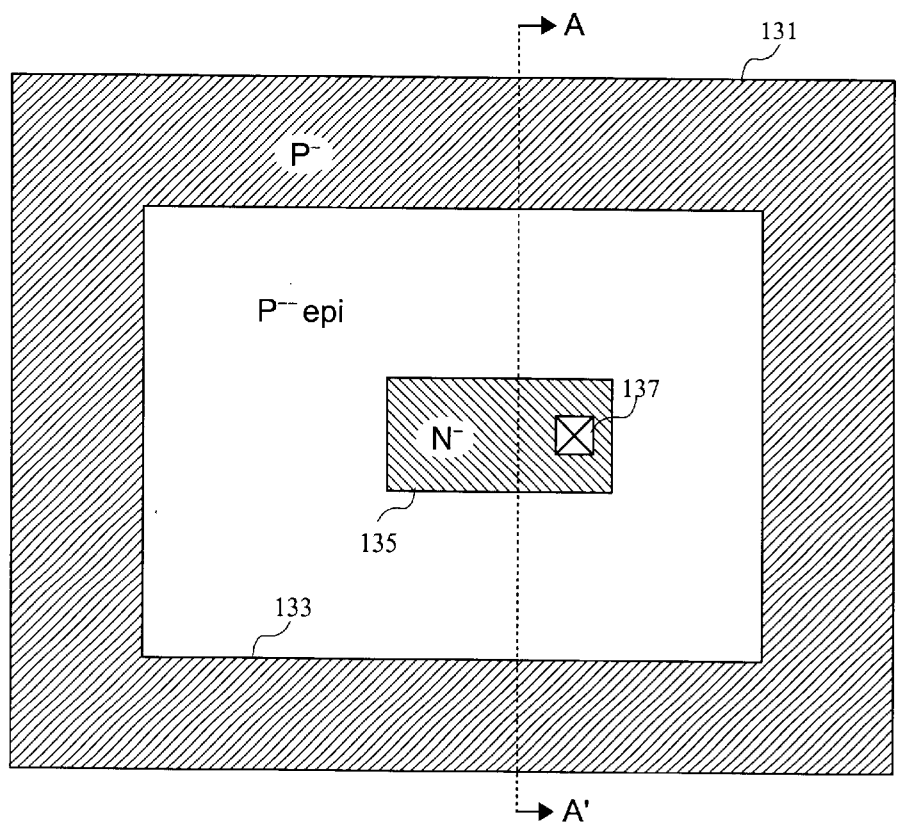
FIG. 2 shows a top view of the pixel image sensor of FIG. 1.

FIG. 2 shows a top view of the pixel image sensor of FIG. 1. In FIG. 2, N-type region 135, corresponding to N-well 107 and deep N-type region 101 in FIG. 1, is centered substantially in the image sensor. P-epi semiconductive material in region 133 (the non-hatching region between regions 135 and 131) surrounds N-type region 135. P-type region 131 encloses N-type region 135 and P-epi region 133. An N+ region 137 is formed in the N-type region 135 to serve as a conductive contact for connecting the N-type region to measuring circuitry. A cross section view along line AA' in FIG. 2 is illustrated in FIG. 1.

Although FIG. 2 shows that P-type region 131 completely encloses the N-type region 135, it is understood that a lateral photodiode element can be formed by a P-type region substantially, but not completely, enclosing the N-type region.

Figure 3:
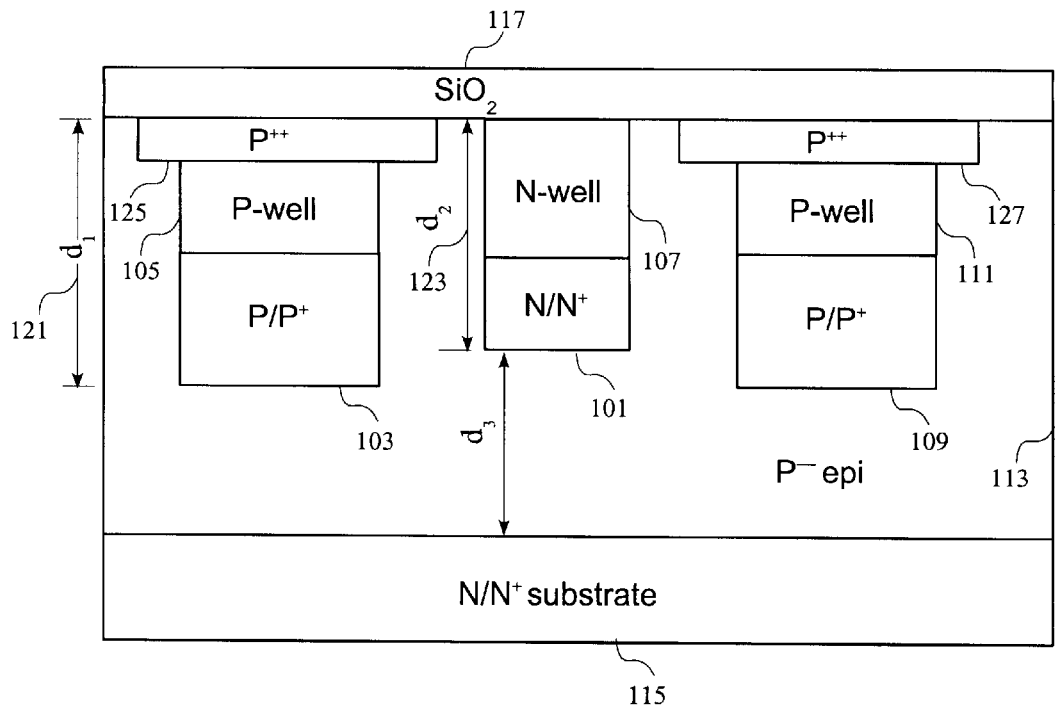
FIG. 3 shows a cross section view of another pixel image sensor according to one embodiment of the present invention.

FIG. 3 shows a cross section view of another pixel image sensor according to one embodiment of the present invention. Similar to the pixel image sensor in FIG. 1, regions 103, 105, 109, 111, 101, 107 and the P-epi region in between form a lateral photodiode element. In addition, a pinning layer (e.g., regions 127 and 125) is formed (e.g., through high doses low energy implant) at near surface of the lateral photodiode element to reduce the noise caused by interface state.

Figure 4:
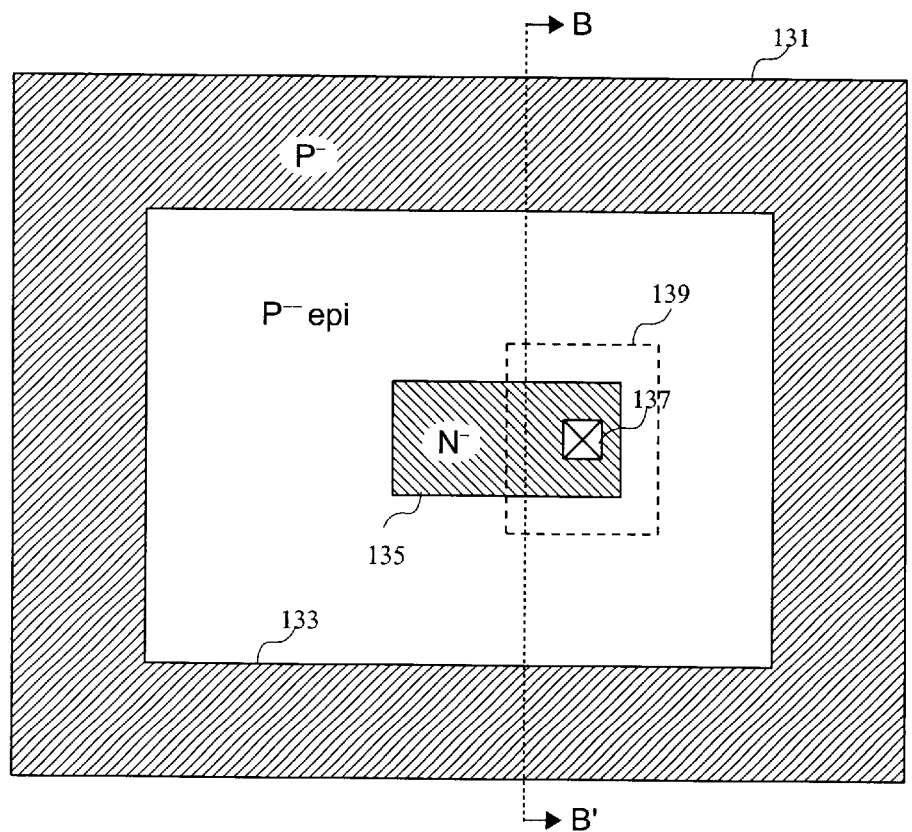
FIG. 4 shows a top view of the pixel image sensor of FIG. 3.

FIG. 4 shows a top view of the pixel image sensor of FIG. 3. Similar to FIG. 2, FIG. 4 shows that N-type region 135 of the lateral photodiode element is substantially surrounded by P-epi region 133 and enclosed by P-type region 131 of the lateral photodiode element. Further, the pinning layer substantially covers the lateral photodiode element. In FIG. 4, the pinning layer covers the area outside region 139, including a portion of N-type region 135, a portion of P-epi region 133 and P-type region 131. A cross section view along line BB' in FIG. 4 is illustrated in FIG. 3. It is understood that FIG. 4 illustrates only the photodiode element. No active transistor is shown in FIG. 4. According to one embodiment of the present invention, active elements (e.g., transistors) can be formed in certain regions of the P-type region (e.g., using a CMOS process). Details of such an embodiment are described below. It is understood that the pinning layer will not cover such regions for active elements.

Figure 5:
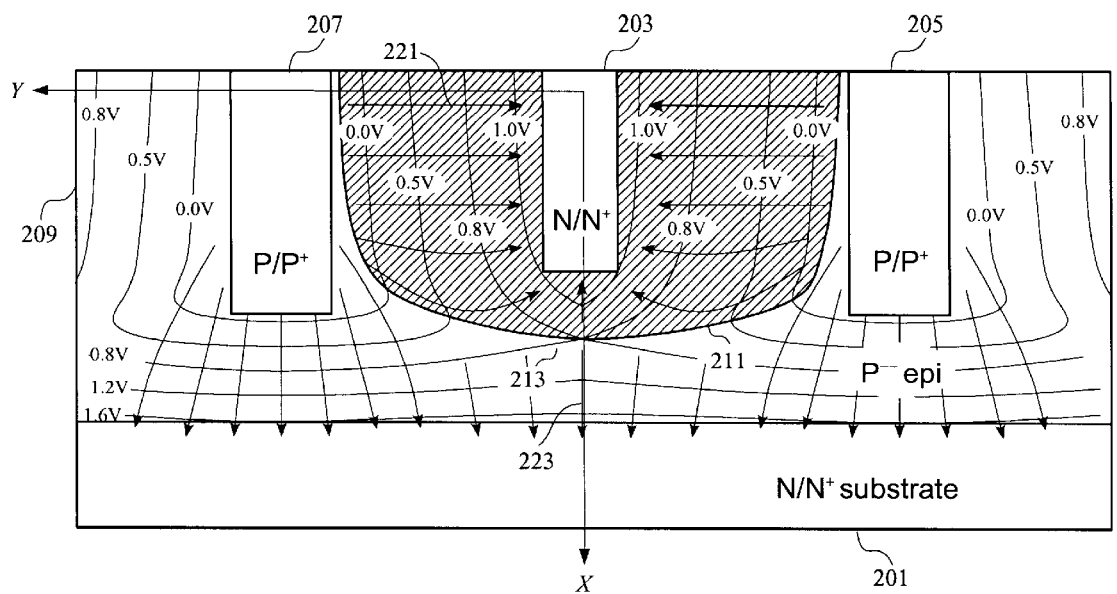
FIG. 5 illustrates an electric field in a pixel image sensor in an accumulation operation according to one embodiment of the present invention.

FIG. 5 illustrates an electric field in a pixel image sensor in an accumulation operation according to one embodiment of the present invention. When the lateral photodiode element is reverse-biased as illustrated in FIG. 5, depletion region 211 has an electric field that forces the electrons generated from photoelectric conversion to move toward N-type region 203 (e.g., as shown laterally in direction 221). Under the influence of the potential level of the enclosing P-type regions 205 and 207, a low voltage region (e.g., near potential line 213) is formed in the P-epi layer between N-type region 203 and substrate 201. The low voltage region serves as a potential barrier, which prevents the electrons collected in region 203 from moving toward substrate 201.

Figure 6:
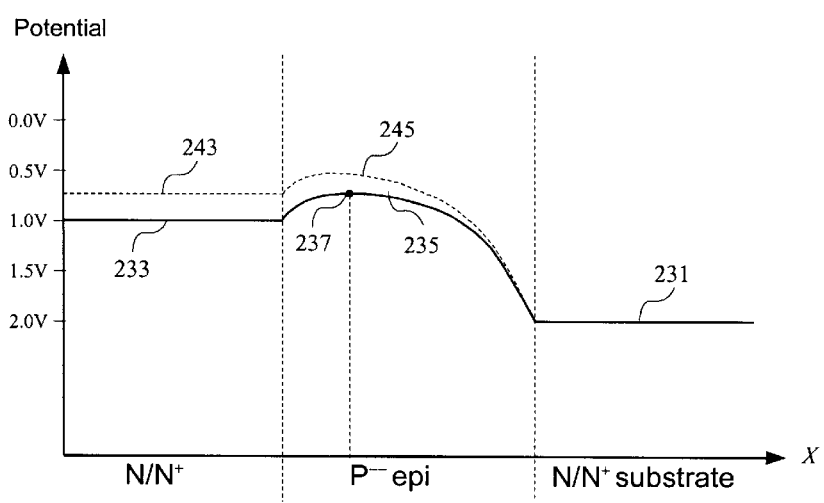
FIG. 6 illustrates a potential distribution along the x-axis of FIG. 5.

FIG. 6 illustrates a potential distribution along the x-axis of FIG. 5. In FIG. 6, curve 235 shows the potential distribution in the P-epi region between the N-region and the substrate. The low voltage region near cross point 237 serves a barrier between the N-type region with potential 233 and the substrate with potential 231. As the N-type region accumulates electrons from photoelectric conversion, the potential level of the N-type region increases. For example, as the potential level of the N-type region increases to level 243, the potential distribution in the P-epi region becomes curve 245. Once electrons are above the barrier region, the electrons are forced into the substrate. Thus, the substrate and the P-epi layer under the lateral photodiode element also serve as a vertical overflow drain system. When the lateral photodiode element receives excessive light so that the photodiode element becomes saturated, excessive electrons in the N-type regions can overflow through the P-epi layer to the substrate. It will prevent blooming and enlarge the dynamic range of the sensor.

Figure 7:
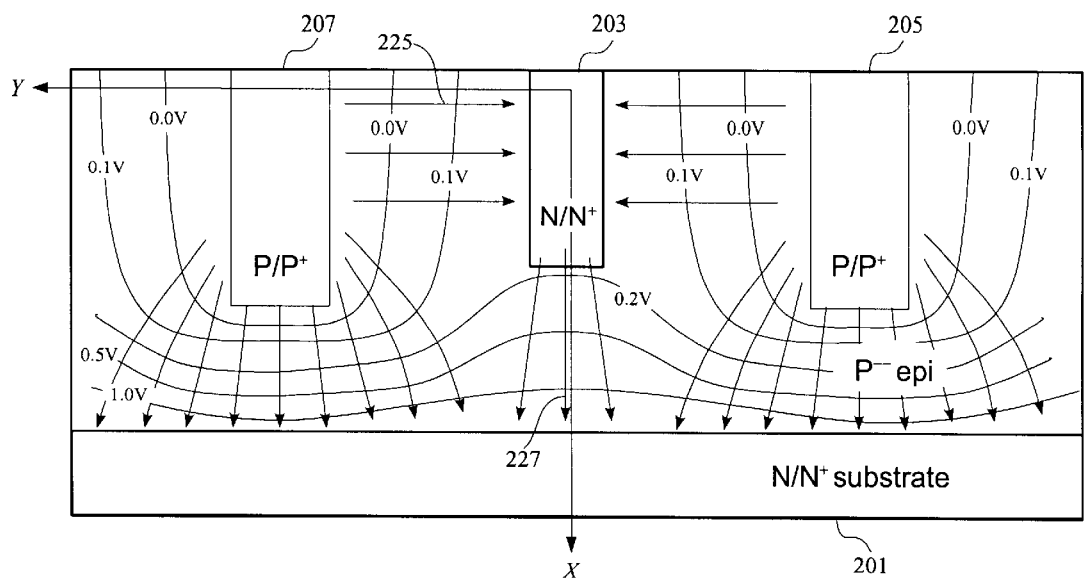
FIG. 7 illustrates an electric field in a pixel image sensor in a reset operation according to one embodiment of the present invention.

FIG. 7 illustrates an electric field in a pixel image sensor in a reset condition according to one embodiment of the present invention. In FIG. 7, the potential level of N-type region 203 reaches a critical value above the potential barrier between N-type region 203 and substrate 201. Thus, the electrons in N-type region 203 flow into substrate 201 (e.g., along direction 227). However, even when the N-type region 203 is at the critical potential level, the lateral photodiode element is still reverse-biased so that any electrons from photoelectric conversion are still forced toward N-type region 203 (e.g., laterally along direction 225).

Figure 8:
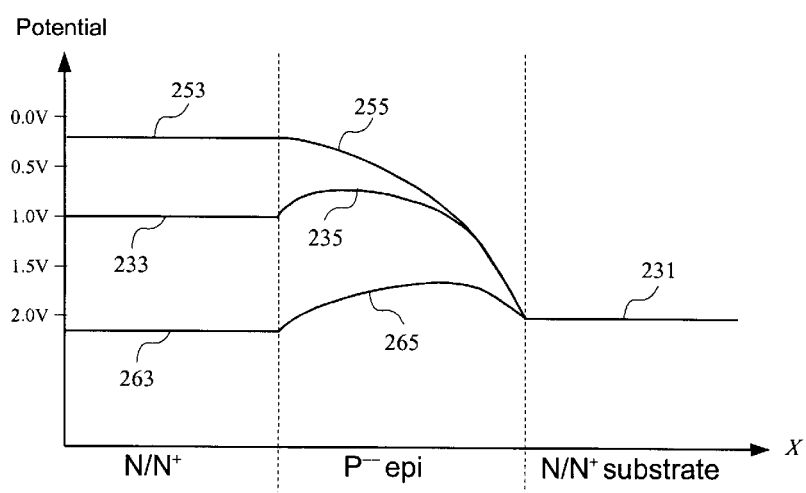
FIG. 8 illustrates potential distributions along the x-axis of FIG. 7 for different operations according to one embodiment of the present invention.

FIG. 8 illustrates potential distributions along the x-axis of FIG. 7 for different operations according to one embodiment of the present invention. When the N-type region is at potential level 233, the potential barrier of curve 235 in the P-epi layer prevents the electrons in the N-type region from moving toward the substrate. When the potential level of the N-type region becomes higher to reach critical level 253, the potential distribution in the P-epi layer becomes monotonic, as shown by curve 255, which allows the electrons accumulated in the N-type region to flow into the substrate. Thus, the N-type region can be reset by forcing the potential level of the N-type region into the critical level.

When the N-type region initially starts to accumulate electrons (e.g., after a reset operation), the size of depletion area is big; thus, the photodiode is more sensitive to light. Further, the potential barrier in the vertical overflow drain system is relatively high; thus, only very few electrons get energy to penetrate the barrier to reach the substrate, while most electrons are collected in the N-type region. When the N-type region accumulates more and more electrons, the size of the depletion area shrinks. Further, the potential barrier becomes relative low for the electrons in N-type region. Thus, the sensitivity of the photodiode will reduces, while the charge leakage to the substrate increases, as the amount of accumulated electrons increases. Therefore, the light sensor has a nonlinear conversion curve; and, sensor sensitivity is high at weak light and low at strong light. Therefore, pixel images sensors according to embodiments of the present invention have large dynamic ranges.

In a signal reading operation, the N-type region is forced into potential level 263. When the N-type region is at potential level 263, a potential barrier 265 in the P-epi layer prevents the electrons in the substrate from entering into the N-type region, while the high voltage at the N-type region causes a reading transistor of the pixel to output a signal for measurement. More details are described below.

Figure 9:
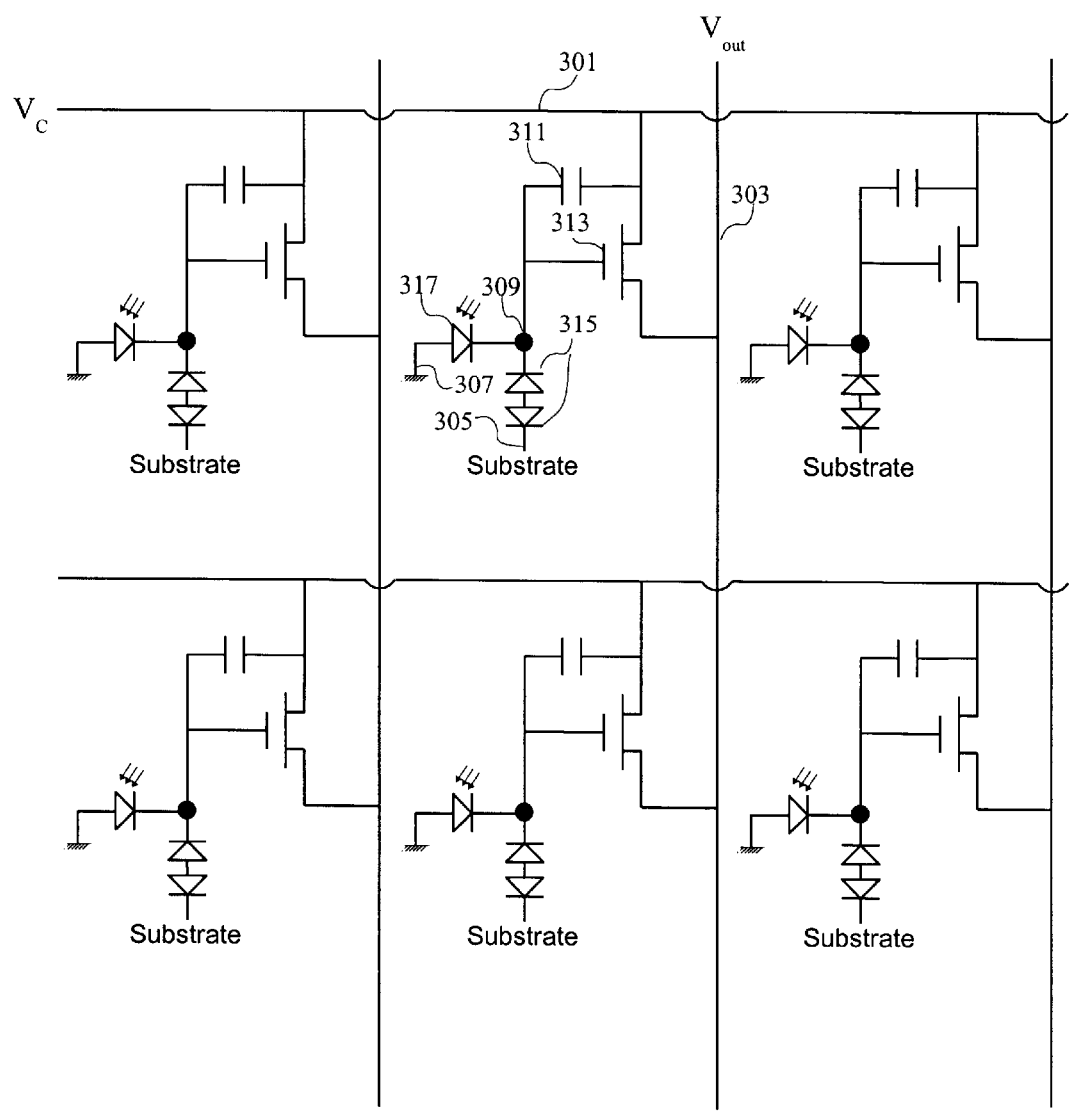
FIG. 9 illustrates a circuit diagram of an array of pixel image sensors according to one embodiment of the present invention.

FIG. 9 illustrates a circuit diagram of an array of pixel image sensors according to one embodiment of the present invention. An active pixel image according to this embodiment of the present invention contains addressing capacitor 311, reading transistor 313, vertical overflow drain system 315 and lateral photodiode 317. In one embodiment of the present invention, the P-region of the lateral photodiode element (e.g., region 131 in FIG. 2) is connected to a ground voltage level 307; and, vertical drain system 315 is connected to the substrate. Control signal $V_C$ is applied on one electrode of addressing capacitor 311 and the drain(source) of the transistor 313 through line 301; and, output signal $V_{out}$ is collected from the source(drain) of transistor 313 through line 303. The array of pixel image sensors can be addressed to generate output signals one row at a time; and, each of the columns can have a measuring circuit for determining the light intensity from the output signal from the reading transistor. In FIG. 9, point 309 corresponds to the charge collecting region, the N-type region of the lateral photodiode element (e.g., region 135 in FIG. 2).

Figure 10:
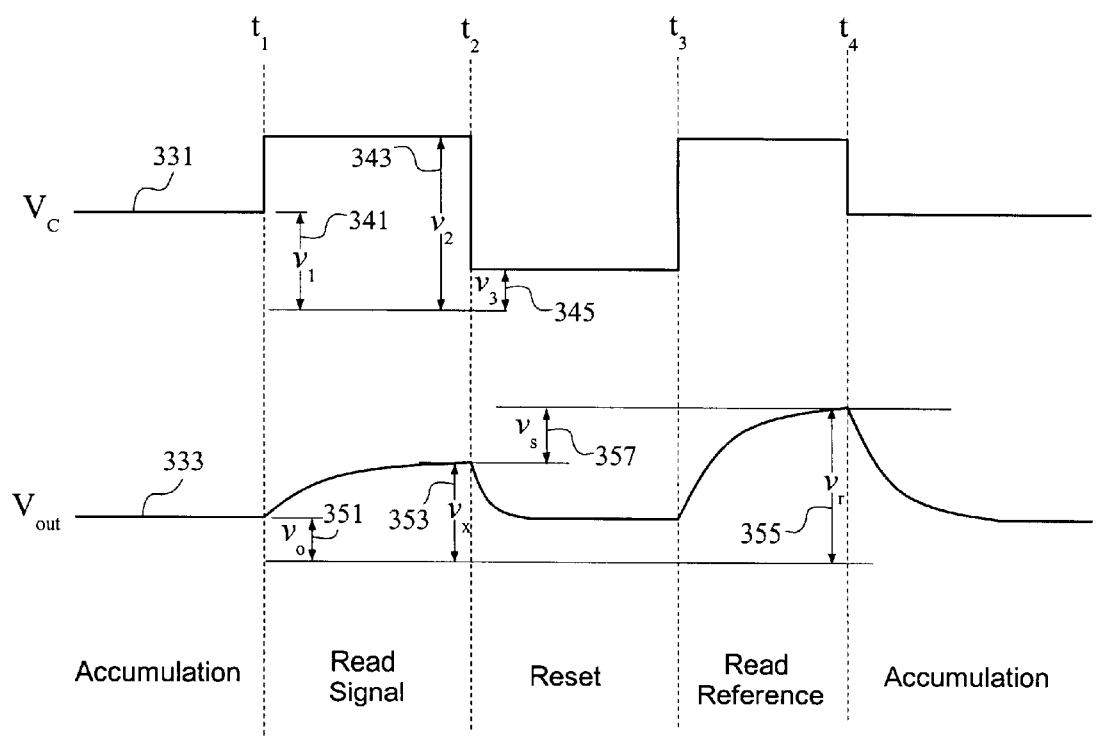
FIG. 10 illustrates signal waveforms for the operation of a pixel image sensor of FIG. 9 according to one embodiment of the present invention.

FIG. 10 illustrates signal waveforms for the operation of a pixel image sensor of FIG. 9 according to one embodiment of the present invention. Signal $V_C$ is applied on line 301 in FIG. 9 to control the operation of the top row of pixel image sensors of FIG. 9; and, signal $V_{out}$ illustrates a typical signal output from line 303 of FIG. 9. When time t<$t_1$, signal $V_C$ is maintained at voltage level $v_1$ 341 (e.g., 2V) so that the voltage level (e.g., 1V) at the gate of the reading transistor (e.g., 313 in FIG. 9) is under a threshold and the reading transistor is not activated (e.g., not open) to generate an output signal. Thus, signal $V_{out}$ at time t<$t_1$ is $v_o$(e.g., 0.5 V), indicating that no output signal is generated for measurement.

When time t is between $t_1$ and $t_2$, signal $V_C$ is increased to $v_2$ 343 (e.g., 5V) so that the voltage level (e.g., 2V) at the gate of the reading transistor is above the threshold and the reading transistor is activated (e.g., open) to generate output signal according to the amount of charge collected at the charge collecting region. At time $t_2$, signal $V_{out}$ reaches $v_x$ 353.

When time t is between $t_2$ and $t_3$, signal $V_C$ is decreased to $V_3$ 345 (e.g., 0V) so that the voltage level at the gate of the reading transistor is under the threshold and the reading transistor is not activated. Thus, signal $V_{out}$ returns to $v_0$. However, the low voltage level at time t near $t_3$ causes the vertical overflow drain system 315 in FIG. 9 increase the potential level of the charge collecting region. Thus, the accumulated electrons in the charge collecting regions are flushed into the substrate at time t=$t_3$.

When time t is between $t_3$ and $t_4$, signal $V_C$ is increased to $v_2$ 343 (e.g., 5V) so that the reading transistor generates a reference signal corresponding to reset level $v_r$ 355 at time $t_4$. The difference $v_s$ between the signal $v_x$ and the reset level $v_r$ indicates the amount of electrons accumulated in the charge collecting region, which can be used to determine the light intensity.

After time t>$t_4$, signal $V_C$ returns to $v_1$ to cause the row of pixel image sensors to accumulate photoelectric electrons in the charge collecting regions for next measurement.

Since the charge collecting regions of the image sensors according to embodiments of the present invention can be reset in buried mode through the vertical overflow drain system. The reset noise is much less than that associated with a conventional reset MOS transistor.

Figure 11:
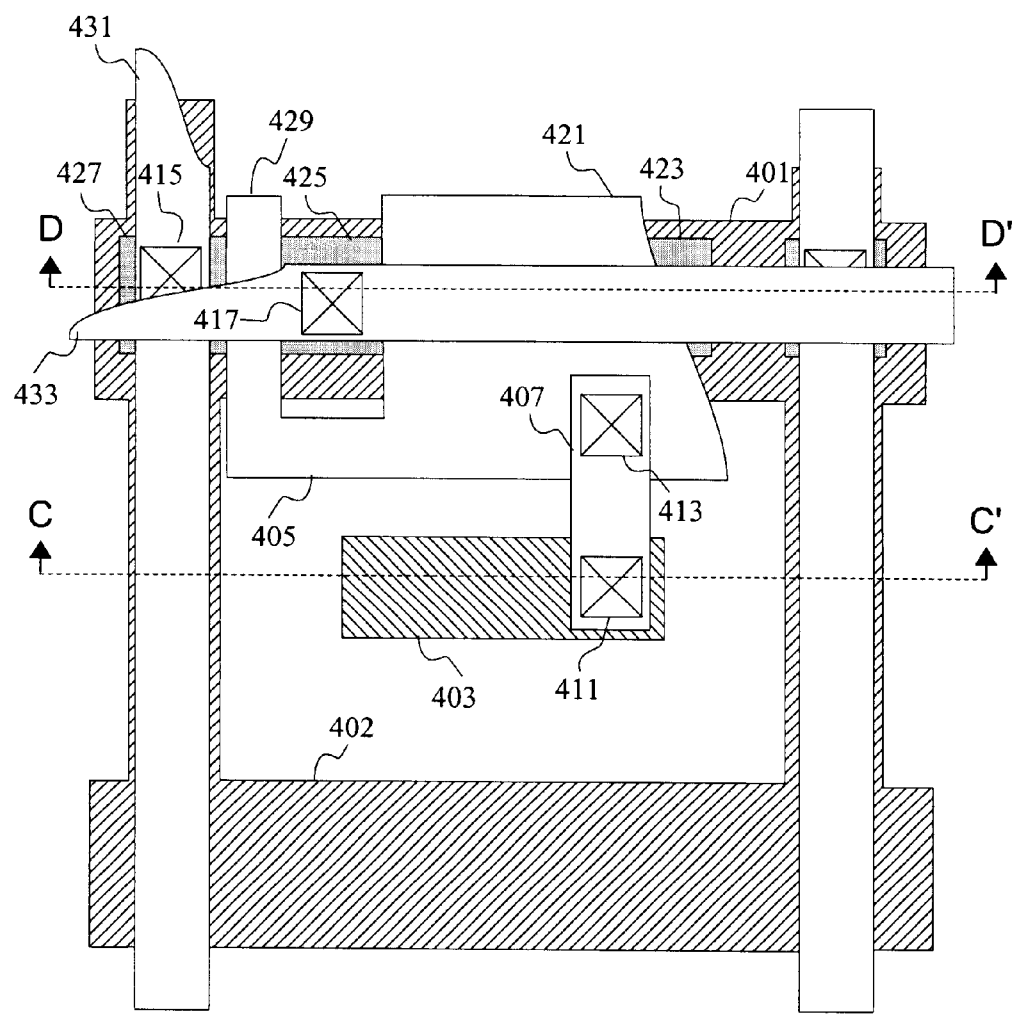
FIG. 11 illustrates a top view of an active pixel sensor according to one embodiment of the present invention.

FIG. 11 illustrates a top view of an active pixel sensor according to one embodiment of the present invention. As illustrated in FIG. 2 (or FIG. 4), P-type region 401 substantially encloses N-type region 403 and its surrounding P-epi region 402 to form a lateral photodiode element. In addition, a standard CMOS process is used to form the addressing capacitor and the reading transistor over the P-well near 401 for the pixel. N+ diffusion regions 423, 425 and 427 are formed in the P-well. Region 423 serves as one of the conducting surfaces of the addressing capacitor; and, regions 425 and 427 serve as the source/drain regions of the reading transistor. Polysilicon layer 405 is formed above an isolation layer over the N+ diffusion regions. Region 429 of the polysilicon layer serves as the gate of the reading transistor; and, region 421 of the polysilicon layer serves as the other conducting surface of the addressing capacitor. Gate region 429 and conducting surface region 421 are interconnected in the polysilicon layer; and, regions 425 and 423 are interconnected in the N+ diffusion region. Metal line 433 is connected to N+ diffusion regions 425 through contact 417 so that the control signal $V_C$ can be applied on one electrode of the addressing capacitor. Metal line 407 connects N-type region 403, the charge collecting region, to the gate of the reading transistor through N+ contact 411 and polysilicon contact 413. The source/drain region 427 of the reading transistor is connected to metal line 431 for outputting signals for measurement.

Figure 12:
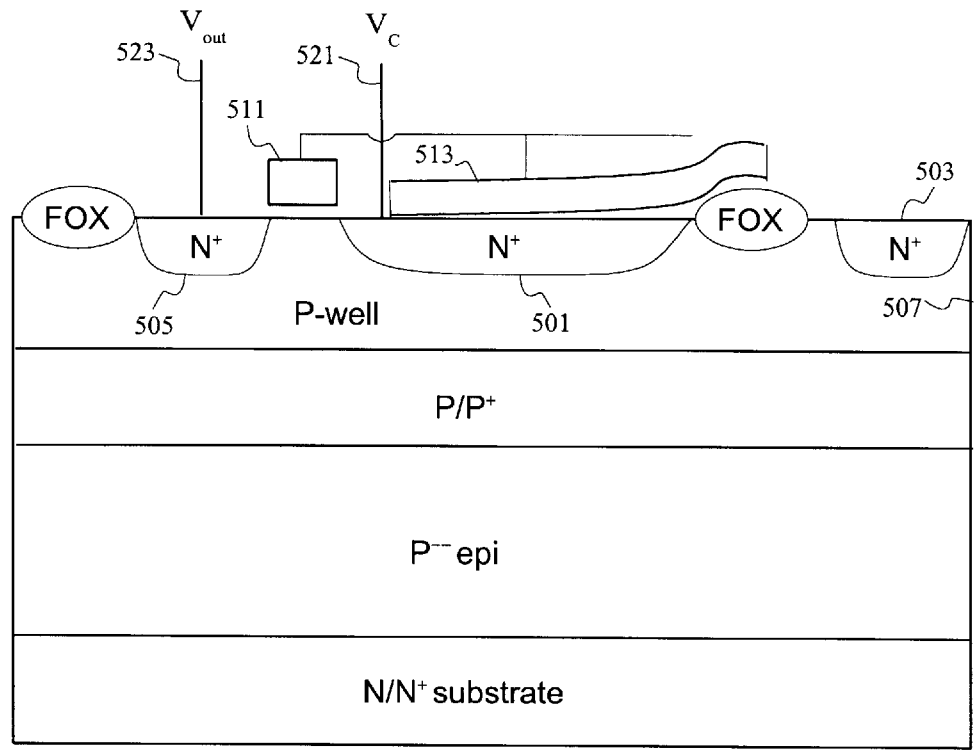
FIGS. 12 and 13 illustrate the cross section views of the active pixel sensor of FIG. 11 according to one embodiment of the present invention.
Figure 13:
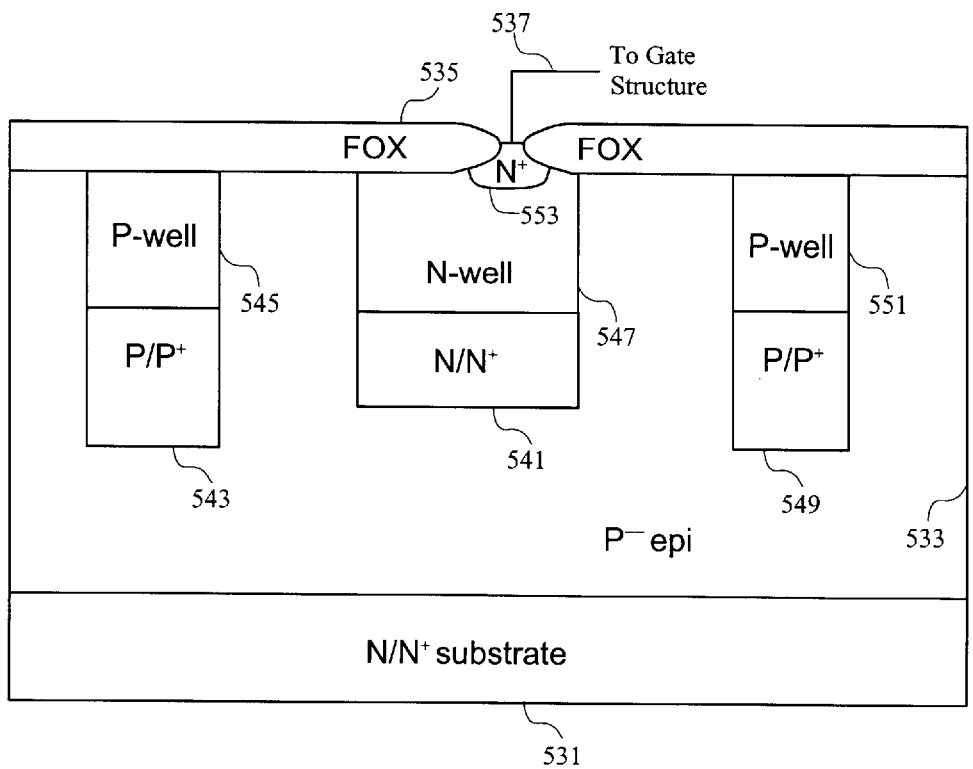

The cross section views along lines CC' and DD' are shown in FIGS. 12 and 13 respectively. FIG. 12 shows the structure of the reading transistor and the addressing capacitor. N+ diffusion region 505 in FIG. 12 corresponds to region 427 in FIG. 11; and, N+ diffusion region 501 in FIG. 12 corresponds to regions 425 and 423 in FIG. 11. Gate structure 511 in FIG. 12 corresponds to polysilicon region 429 in FIG. 11; and, capacitor surface 513 in FIG. 12 corresponds to polysilicon region 421 in FIG. 11. Thus, the source (or drain) of the reading transistor is directly coupled to one electrode of the addressing capacitor in N+ diffusion region 501 in FIG. 12; and, the gate of the reading transistor is directly coupled to the other electrode of the addressing capacitor in polysilicon region 405 in FIG. 11. Contact 521 connects the addressing capacitor and the drain (or source of the reading transistor to metal lines 433.

Similar to FIGS. 1 and 3, FIG. 13 shows the coupling between the lateral photodiode element and the vertical overflow drain system. N+ contact region 553 provides a connection from the charge collecting region 547 and 541 to the gate of the reading transistor through a metal line, which is illustrated as line 537, corresponding to metal line 407 in FIG. 11. P-type regions 543, 545, 549 and 551 enclose N-type regions 547 and 541 and their surrounding P-epi region of P-epi layer 533 to form the lateral photodiode element. Substrate 531 and the P-epi region in P-epi layer 533 under the lateral photodiode element form the vertical overflow drain system.

Figure 14:
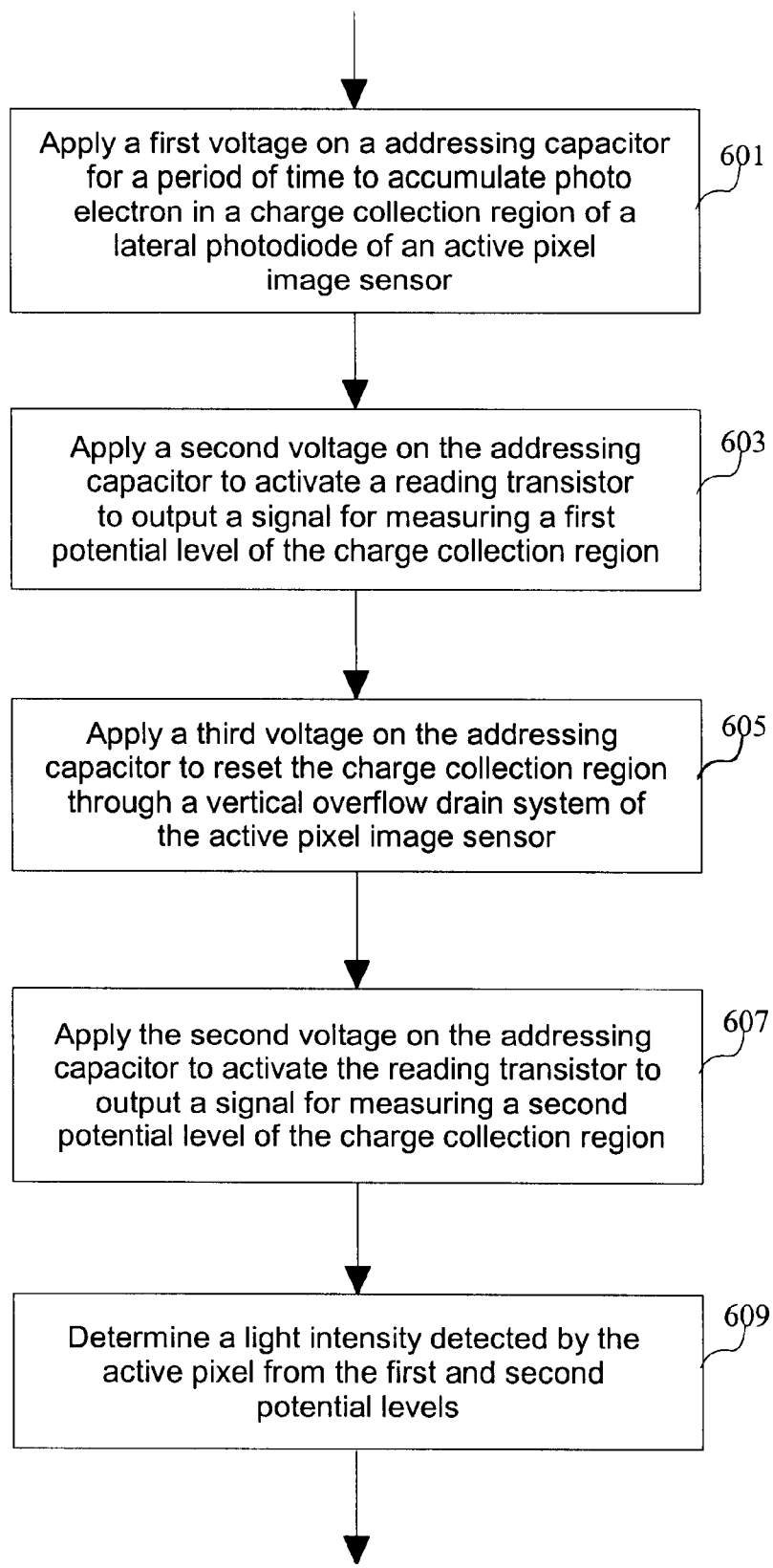
FIG. 14 shows a flow chart for a method to measure light intensity according to one embodiment of the present invention.

FIG. 14 shows a flow chart for a method to measure light intensity according to one embodiment of the present invention. Operation 601 applies a first voltage on an addressing capacitor for a period of time to accumulate photo electrons in a charge collecting region of a lateral photodiode of an active pixel image sensor. Operation 603 applies a second voltage on the addressing capacitor to activate a reading transistor to output a signal for measuring a first potential level of the charge collecting region. Operation 605 applies a third voltage on the addressing capacitor to reset the charge collecting region through a vertical overflow drain system of the active pixel image sensor. Operation 607 applies the second voltage on the addressing capacitor to activate the reading transistor to output a signal for measuring a second potential level of the charge collecting region. Operation 609 determines a light intensity detected by the active pixel from the first and second potential levels (e.g., using a CDS method).

Thus, according to one embodiment of the present invention, a pixel image sensor with low cost and high flexibility in system integration can be fabricated using a modified CMOS process. The pixel image sensor has a lateral PN junction to server as a photodiode, which is more suitable for small geometry cell design. The pixel image sensor has a vertical overflow drain system, which is used to reset the image cell. Resetting using the vertical overflow drain system greatly reduces the reset noise, when compared with a conventional CMOS APS approach using a reset transistor. Since the pixel image sensor has no reset transistor, the sensor layout can be optimized; and, the fill factor and sensitivity are improved.

While many examples are illustrated using a lateral photodiode element with an N-type region at the center of the lateral photodiode element as a charge collecting region, it will be apparent to one skilled in the art from this description that lateral photodiode elements can also be implemented with a P-type region at the center of the lateral photodiode element as the charge collecting region. Further, a P-type substrate can be used. Furthermore, the vertical overflow drain system can have more than one layer of P-epi (or N-epi) semiconductive material, including one or more N- or P-layers.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An image sensor pixel, comprising:
   a lateral photodiode element, the lateral photodiode element having a first region of a first conductive type, a third region of a first semiconductive material and a second region of a second conductive type, the third region surrounding laterally the first region, the second region substantially surrounding the third region to substantially enclose the first region, the first semiconductive material having a dopant density substantially lower than a dopant density of the first region and a dopant density of the second region; and
   a vertical overflow drain system coupled with the lateral photodiode element, the vertical overflow drain system having a first layer of a second semiconductive material and a second layer, the first layer separating the lateral photodiode element and the second layer, the second semiconductive material having a dopant density substantially lower than an average dopant density of the second layer and the dopant density of the first region.

2. An image sensor pixel as in claim 1 wherein the first semiconductive material is of one of:
   a) the first conductive type;
   b) the second conductive type; and
   c) an intrinsic type.

3. An image sensor pixel as in claim 2 wherein the first semiconductive material and the second semiconductive material are of a same type; and, the dopant density of the first semiconductive material is substantially the same as the dopant density of the second semiconductive material.

4. An image sensor pixel as in claim 1 wherein the first conductive type is N-type; the second conductive type is P-type; the second layer comprises an N-type substrate;
   and, the first region collects electrons generated from photoelectric conversion in the lateral photodiode element when the lateral photodiode element is reverse biased.

5. An image sensor pixel as in claim 1 wherein the first conductive type is P-type; the second conductive type is N-type; the second layer comprises a P-type substrate; and, the first region collects electric charges generated from photoelectric conversion in the lateral photodiode element when the lateral photodiode element is reverse biased.

6. An image sensor pixel as in claim 1 wherein the first region collects electric charges generated from photoelectric conversion in the lateral photodiode element when the lateral photodiode element is reverse biased; and, when the second region is at a second potential level and the second layer is at a third potential level, a potential barrier formed in the vertical overflow drain system prevents the electric charges in the first region from moving across the first layer into the second layer until the first region approaches a first potential level.

7. An image sensor pixel as in claim 6 wherein the potential barrier prevents electric charges in the second layer from moving across the first layer into the first region.

8. An image sensor pixel as in claim 6 wherein, when the second region is at a second potential level and the second layer is at a third potential level, the electric charges in the first region are capable of moving across the first layer into the second layer when the first region approaches the first potential level.

9. An image sensor pixel as in claim 8 wherein the lateral photodiode element is not forward biased when the second region is at the second potential level and the first region approaches the first potential level.

10. An image sensor pixel as in claim 1 further comprising:
   a transistor having a gate structure, a source region and a drain region, the gate structure being electrically connected to the first region; and
   a capacitor having a first conductive surface and a second conductive surface, the first conductive surface being electrically insulated from the second conductive surface, the first conductive surface being electrically connected to the first region.

11. An image sensor pixel as in claim 10 wherein the first region collects electric charges generated from photoelectric conversion in the lateral photodiode element when the lateral photodiode element is reverse biased; and, when the second region is at a second potential level and the second layer is at a third potential level, a potential barrier formed in the vertical overflow drain system prevents electric charges from moving, across the first layer, between the second layer and the first region until the first region approaches a first potential level.

12. An image sensor pixel as in claim 11 wherein:
   a) when the second conductive surface of the capacitor is maintained at a fourth potential level, the transistor is not activated to generate an output signal, and the first region does not approach the first potential level until enough electric charges are accumulated in the first region to cause the first region to approach the first potential level;
   b) when the second conductive surface of the capacitor is maintained at a fifth potential level, the transistor is activated to generate an output signal for measuring electric charges accumulated in the first region, and the first region does not approach the first potential level until enough electric charges are accumulated in the first region to cause the first region to approach the first potential level; and
   c) when the second conductive surface of the capacitor is maintained at a sixth potential level, the transistor is not activated to generate an output signal, and the first region is forced into the first potential level to allow electric charges accumulated in the first region to move across the first layer into the second layer.

13. An image sensor pixel as in claim 12 wherein the first conductive type is N-type; the second conductive type is P-type; the second layer comprises an N-type substrate.

14. An image sensor pixel as in claim 13 wherein the sixth potential level is higher than the fourth potential level; and, the fourth potential level is higher than the fifth potential level.

15. An image sensor pixel as in claim 11 wherein the second conductive surface is electrically connected to one of: the source region and the drain region.

16. An image sensor pixel as in claim 1 wherein the first region is smaller laterally than the third region between the first region and the second region.

17. An image sensor pixel as in claim 1 wherein the second layer comprises a substrate of the first conductive type and a layer of the second conductive type disposed between the first layer and the substrate.

18. An image sensor pixel as in claim 1 further comprising:
   a pinning layer of the second conductive type disposed above the lateral photodiode element on a side opposite to the first layer, the pinning layer at least partially in contact with the first region, the second region and the third region.

* * * * *